(12) United States Patent
Letterman, Jr. et al.

(10) Patent No.: US 6,376,266 B1
(45) Date of Patent: Apr. 23, 2002

(54) SEMICONDUCTOR PACKAGE AND METHOD FOR FORMING SAME

(75) Inventors: James Price Letterman, Jr., Mesa, AZ (US); Kenneth Teik Kheong Low, Singapore (SG); Saat Shukri Embong, Kuala Terengganu (MY); Chee Hiong Chew, Negeri Sembilan (MY); Boon Huat Lim, Johor (MY); Aik Chong Tan, Johor Bahru (MY); Albert Laninga, Tempe, AZ (US); Santhiragasen a/l sengram Pillay, Negeri Sembilan (MY); Michael John Seddon, Gilbert; Brian Webb, Chandler, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 53 days.

(21) Appl. No.: 09/706,599

(22) Filed: Nov. 6, 2000

(51) Int. Cl.$^7$ .......................... H01L 21/66; G01R 31/26

(52) U.S. Cl. .......................................... 438/15; 438/106

(58) Field of Search .............................. 438/15, 26, 51, 438/64, 14, 17, 106, 108, 113, 118; 257/495, 673, 680, 796, 924

(56) References Cited

U.S. PATENT DOCUMENTS

| | | | | |
|---|---|---|---|---|
| 4,989,069 A | * | 1/1991 | Hawkins | 357/74 |
| 5,117,279 A | * | 5/1992 | Karpman | 357/72 |
| 5,319,242 A | * | 6/1994 | Carney et al. | 257/680 |
| 5,834,832 A | * | 11/1998 | Kweon et al. | 257/495 |
| 6,020,649 A | * | 2/2000 | Watanabe et al. | 257/796 |

* cited by examiner

Primary Examiner—David Nelms
Assistant Examiner—Phuc T. Dang

(57) ABSTRACT

A semiconductor package (8) with a die (10) having die pads (16) coupled to inner ends (22) of interconnects (20), the die (10) and the interconnects (20) are molded in mold compound (30) with mounting surface (12) and outer ends (24) exposed. A semiconductor die has an interconnect surface opposite the mounting surface.

16 Claims, 3 Drawing Sheets

SEMICONDUCTOR PACKAGE AND METHOD FOR FORMING SAME

FIELD OF THE INVENTION

The present invention relates in general to a semiconductor package and a method of forming the semiconductor package, and more particularly to a semiconductor package and method of forming the semiconductor package using a removable carrier.

BACKGROUND OF THE INVENTION

As is known, a semiconductor die does not lend itself readily to handing and mounting on, for example, a printed circuit board (PCB). Typically, a semiconductor die is packaged in a semiconductor package, which can be conveniently handled and mounted both manually and by automated machines. In conventional semiconductor packaging a semiconductor die is mounted on a leadframe. A leadframe provides a portion for mounting the die, often called a flag portion, and has lead portions having an inner and an outer end. The leadframe holds the flag portion and the lead portions in position relative to each other while the die is mounted on the flag portion, and wires connected between the die and the inner ends of the lead portions.

The die, the flag portion, inner ends of the lead portions, and the wires, are then encapsulated in mould compound to form a semiconductor package with the outer ends of the lead portions and outer portions of the lead frame extending from the semiconductor package. After encapsulation, the outer portion of the leadframe is cut to separate the semiconductor package from the leadframe. Prior to the step of encapsulation the leadframe provides support to hold the die and lead portions in position. However, after encapsulation, the mould compound provides the support. In addition, after separation, the outer portions of the leadframe are discarded.

Hence, the leadframe performs a temporary support function, which results in the additional step of separation, and also results in waste of leadframe material.

BRIEF DESCRIPTION OF THE DRAWINGS

Embodiments of the invention will now be more fully described, by way of example, with reference to the drawings of which.

DETAIL DESCRIPTION OF THE DRAWINGS

Figure 1:
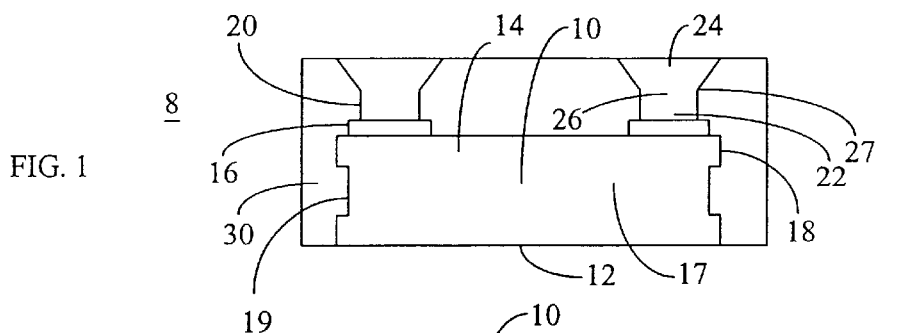
FIG. 1 shows a side sectional view of a semiconductor package in accordance with the present invention.

FIG. 1 shows a semiconductor package 8 with at least one semiconductor die 10, at least one interconnect 20, and encapsulant 30, such as mould compound. The die 10 has a mounting surface 12 and an interconnect surface 14, where the interconnect surface 14 is opposite the mounting surface 12. The mounting surface 12 forms the back of the semiconductor die 10 and usually comprises a layer of metallisation, which typically forms an electrical ground terminal for electronic circuitry in the die 10, and also provides a surface for mounting the die 10. The interconnect surface 14 has at least one die pad 16. The die pad 16 is formed by a layer of metallisation. When connection to the pad 16 is by soldering, then the layer of metallisation is made of solder.

An intermediate portion 17 between the mounting surface 12 and the interconnect surface 14 forms the body of the die 10 with side surfaces 18. The side surfaces 18 can be shaped to have contours 19. The contours 19 provide improved mould locking which increases the mechanical strength with which the encapsulant 30 holds the die 10 in the package 8. In addition, the contours 19 improve sealing between the die 10 and the encapsulant 30. The improved seal reduces penetration of moisture into the package, and this advantageously results in improved package reliability.

The interconnect 20 has an inner end 22 which connects to the at least one die pad 16, an outer end 24 for external connection, and an intermediate portion 26. The intermediate portion 26 extends between the inner end 22 and the outer end 24 and forms the body of the interconnect 20. The intermediate portion 26 can be shaped to allow for convenient handling by a pick and place machine. In addition, the intermediate portion 26 can include mould lock features 27 to improve mould locking between the encapsulant 30 and the interconnect 20, which brings the same benefits of increased mechanical strength and improved sealing described earlier. The interconnect 20 can be made of tinplated copper pieces. The encapsulant 30 encapsulates the die 10 and the interconnects 20. In order to ensure good mould locking between the encapsulant 30 and both the die 10 and interconnect 20, it is important that the encapsulant 30 which is used has characteristics which enables the mould compound 30 to flow into the contours 19, and also to fill the mould lock features 27 during encapsulation.

Figure 2A:
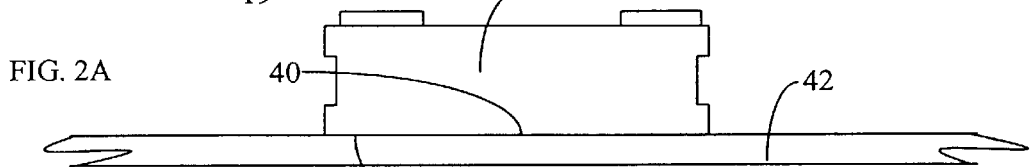
FIGS. 2A–2E shows a side sectional view of the semiconductor package in FIG. 1 being formed.

In FIG. 2A, the semiconductor die 10 is placed with its mounting surface 12 on a semiconductor mounting surface 40 of a carrier 42. The carrier 42 is a polymer and the semiconductor mounting surface 40 holds the semiconductor die 10 releasably, i.e. such that the die 10 and the mounting surface 12 can be separated after encapsulation. In addition, the carrier 42 is able to withstand the rigors of encapsulation, while securing the die 10 firmly during other processes prior to encapsulation. In order to secure the die 10, the mounting surface 40 may be specially provided with adhesive or the entire surface of the carrier may be provided with a layer of adhesive. Alternatively or additionally, the carrier 42 can have die holding features, such as clips (not shown) to hold the die 10 onto the carrier 42.

Figure 2B:
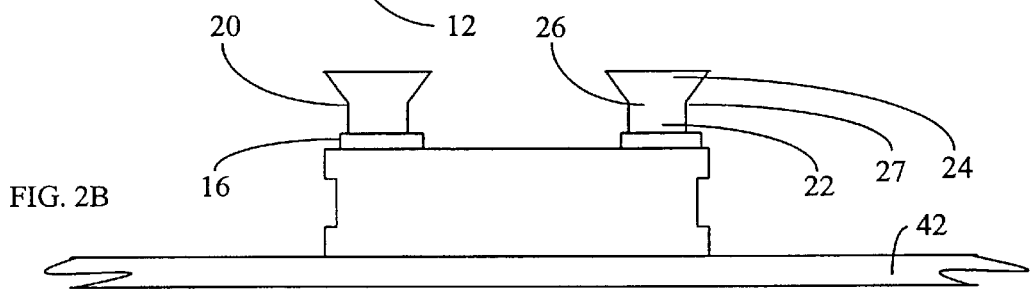

In FIG. 2B, the interconnect 20 is mounted on the die 10 by connecting the inner ends 22 to the die pads 16. This can be accomplished in a variety of ways including by solder, epoxy, thermosonic bonding, or thermocompression bonding.

Figure 2C:
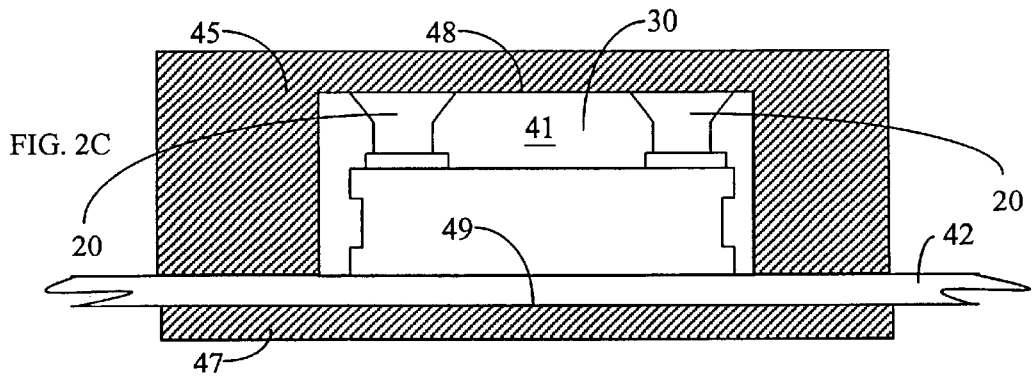

In FIG. 2C, the encapsulant 30 encapsulates the die 10 and the interconnects 20 to form the semiconductor package 8 on the carrier 42. This can be accomplished by enclosing the carrier 42, the die 10 and the interconnects 20 within a mould cavity 41 that is formed between two mould pieces i.e. an upper mould piece 45 and a lower mould piece 47. Upper and lower surfaces of the mould cavity, 48 and 49 respectively, will be of such dimension as to sandwich the die 10, the interconnects 20, and the carrier 42 between them. Resilience of the carrier 42 ensures a good seal between the mould pieces 45 and 47 during the encapsulation process.

Figure 2D:
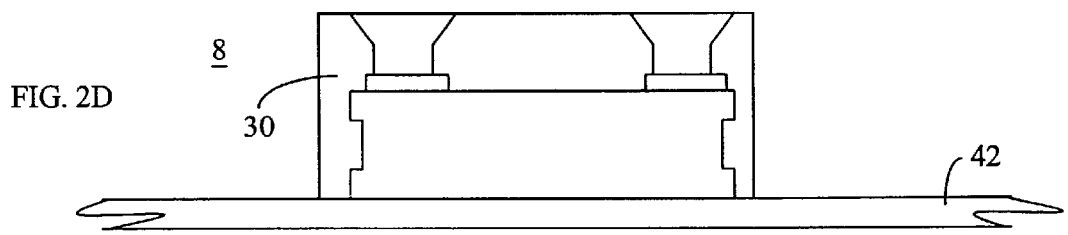

In FIG. 2D, the semiconductor package 8 is formed on the carrier 42 after encapsulation and is shown after moving the mould pieces 45 and 47 away.

Figure 2E:
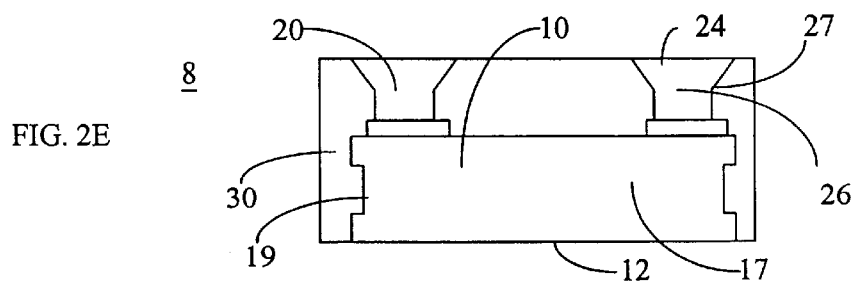

In FIG. 2E, the semiconductor package 8 is removed from the carrier 42. This may be accomplished using a pick and place operation, where the package 8 is picked off the carrier 42 by a pick and place arm, for example. Alternatively, a simple stripping process where a removal blade is positioned to wedge the packages off the carrier as the carrier and blade are moved in opposite directions relative to each other, may be employed.

The encapsulant 30 surrounds the intermediate portion 17 of the die 10 and the intermediate portion 26 of the interconnect 20, and fills the contours 19 and the mould lock features 27. However, the mounting surface 12 of the die 10 and the outer end 24 of the interconnect 20 is not encapsulated, i.e. the mounting surface 12 of the die 10 and the outer end 24 of the interconnect 20 are left exposed.

Figure 3:
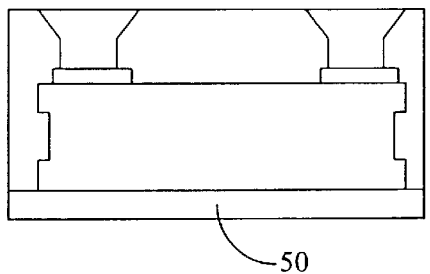
FIG. 3 shows a side sectional view of the semiconductor package in FIG. 1 with a heat sink attached.

In FIG. 3, a heatsink 50 is coupled to the mounting surface 12 of the die 10. This may be accomplished by solder, heat conductive epoxy, or bonding. The heatsink 50 can be made of tin-plated copper and may be shaped to suit particular heat dissipation and mounting requirements.

Figure 4:
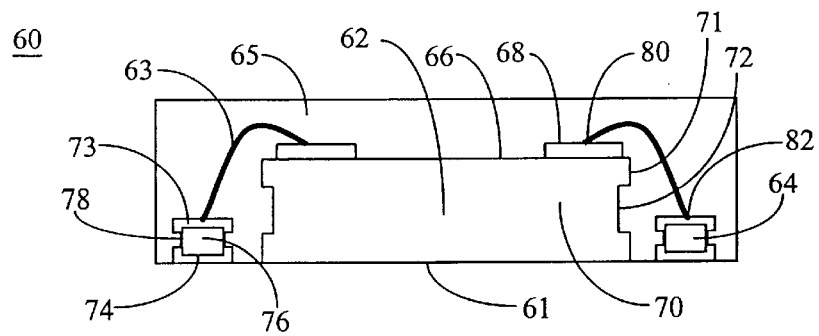
FIG. 4 shows a side sectional view of a semiconductor package in accordance with the present invention.

In FIG. 4 a semiconductor package 60 has at least one semiconductor die 62, at least one connector 63, at least one interconnect 64, and encapsulant 65, such as mould compound. The die 62 has a mounting surface 61 and an interconnect surface 66, where the interconnect surface 66 is opposite the mounting surface 61. The mounting surface 61 forms the back of the semiconductor die 62 and usually comprises a layer of metallisation, which typically forms an electrical ground terminal for electronic circuitry in the die 62, and also provides a surface for mounting the die 62. The interconnect surface 66 has at least one die pad 68. The die pad 68 is formed by a layer of metallisation.

An intermediate portion 70 between the mounting surface 61 and the interconnect surface 66 forms the body of the die 62 with side surfaces 71. The side surfaces 71 can be shaped to have contours 72. The contours 72 provide improved mould locking which increases the mechanical strength with which the encapsulant 65 holds the die 62 in the package 60. In addition, the contours 72 improve sealing between the die 62 and the encapsulant 65. The improved seal reduces penetration of moisture into the package 60, and this results in improved package reliability.

The interconnects 64 each have an inner end 73 for connecting to the at least one die pad 68, an outer end 74 for external connection, and an intermediate portion 26. The intermediate portion 76 extends between the inner end 73 and the outer end 74 and forms the body of the interconnect 64. The intermediate portion 76 can be shaped to allow for convenient handling by a pick and place machine, for example. In addition, the intermediate portion 76 can include mould lock features 78 to improve the mechanical strength with which the encapsulant 65 holds the interconnects 64, to bring the same benefits of increased mechanical strength and improved sealing described earlier. The interconnects 64 can be made of tin plated copper pieces.

The connectors 63 each have a die end 80 for coupling to the die pad 68, and an interconnect end 82 for connecting to the inner end 73 of the interconnects 64. The connectors 63 are typically lengths of wire, either gold, aluminum or copper wire, whose ends are bonded to the die pad 68 and the inner end 73 to form an electrical connection therebetween. The encapsulant 65 encapsulates the die 62, the connectors 63 and the interconnects 64.

Figure 5A:
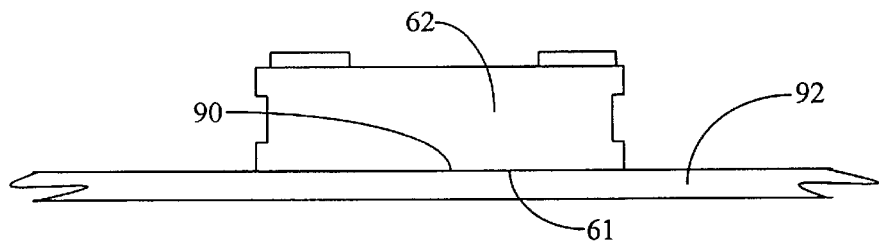
FIGS. 5A–5F shows a side sectional view of the semiconductor package in FIG. 4 being formed.

In FIG. 5A, the semiconductor die 62 is placed with its mounting surface 61 on a semiconductor mounting surface 90 of a carrier 92. The carrier 92 is a polymer and the semiconductor mounting surface 90 holds the semiconductor die 62 releasably, i.e. such that the die 62 and the mounting surface 90 can be separated after encapsulation. In addition, the carrier 92 is able to withstand the rigors of encapsulation, while securing the die 62 firmly during other processes prior to encapsulation. In order to secure the die 62, the mounting surface 90 may be specially provided with adhesive or the entire surface of the carrier maybe provided with a layer of adhesive.

Figure 5B:
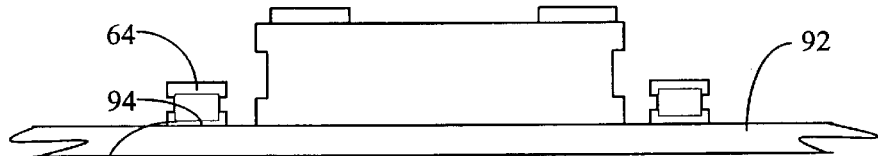

In FIG. 5B, the interconnect 64 is placed with its outer end 74 on an interconnect mounting surface 94 of a carrier 92. A pick and place process, typically performed by an automated machine, could be used to place the interconnect 64 on the interconnect mounting surface 94.

Figure 5C:
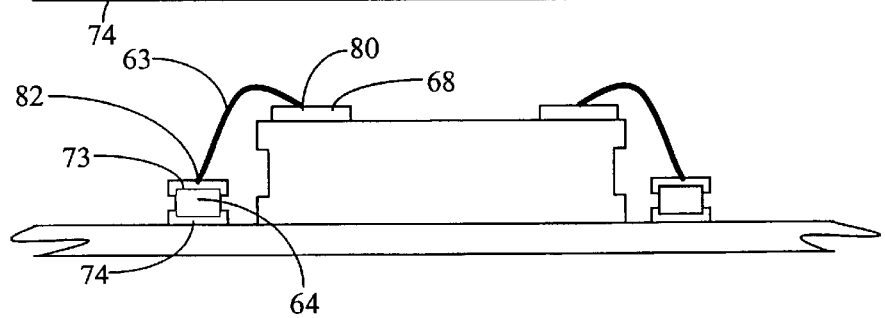

In FIG. 5C, the connectors 63 are connected between the die pad 68 and the inner end 73 of the interconnects 64. When ultrasonic thermocompression bonding is used to connect the connector 63, comprising a length of wire, typically gold wire, a free end of a supply the wire (not shown) is formed into a ball (not shown). The ball forms the die end 80 which is bonded to the die pad 68. A length of the wire is then supplied and the end of the length of wire, which forms the interconnect end 82, is bonded to the inner end 73 and the wire severed from the supply.

Figure 5D:
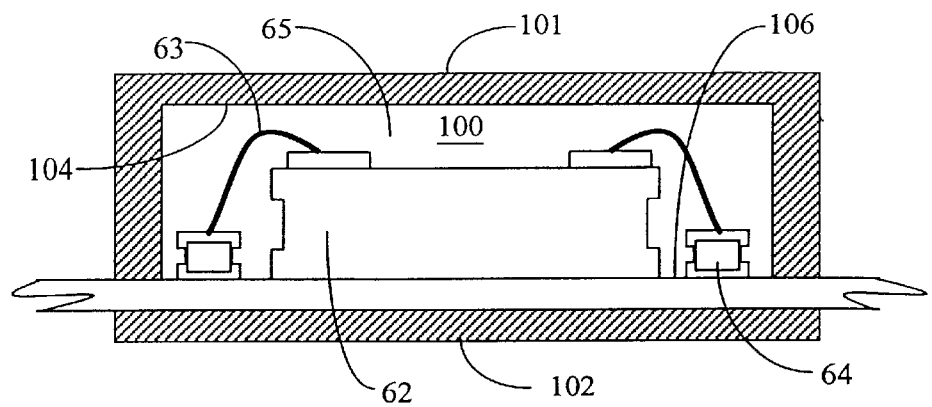

In FIG. 5D, the encapsulant 65 encapsulates the die 62, the connectors 63, the interconnect mounting surface 94, and the interconnects 64 to form the semiconductor package 60 on the carrier 92. This can be accomplished by enclosing the mounting surface 90 of the carrier 92, the die 62, the connectors 63, and the interconnects 64, within a mould cavity 100 that is formed between two mould pieces i.e. an upper mould piece 101 and a lower mould piece 102. Upper and lower surfaces of the mould cavity, 104 and 106 respectively, will be of such dimension as ensure the connectors 63 are completely encapsulated. Resilience of the carrier 92 ensures a good seal between the mould pieces 10 1 and 102 during encapsulation.

Figure 5E:
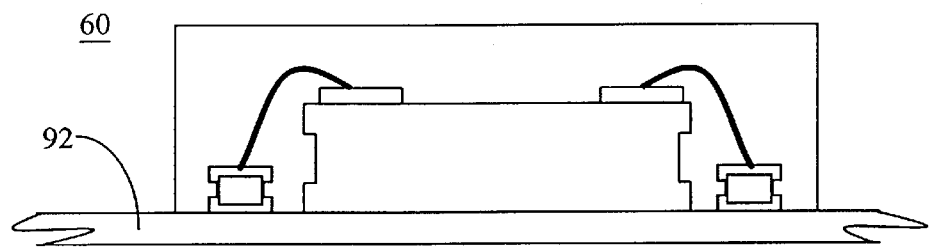

In FIG. 5E, the semiconductor package. 60 is formed on the carrier 92 after encapsulation and is shown after moving the mould pieces 10 1 and 102, away.

Figure 5F:
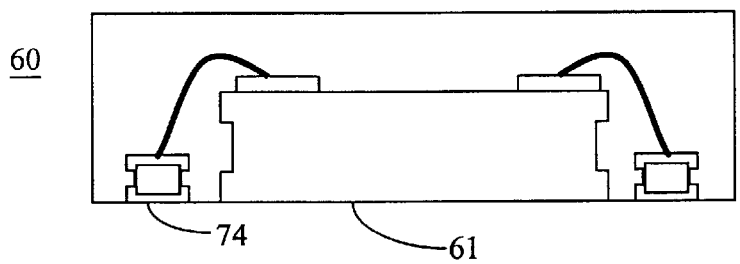

In FIG. 5F, the package 60 is removed from the carrier 92. The encapsulant 65 surrounds the intermediate portion 70 of the die 62, the connectors 63, and the intermediate portion 78 of the interconnects 64. However, the mounting surface 61 of the die 62 and the outer ends 74 of the interconnects 64 are not encapsulated, i.e. the mounting surface 61 of the die 62 and the outer ends 74 of the interconnects 64, are left exposed.

Figure 6:
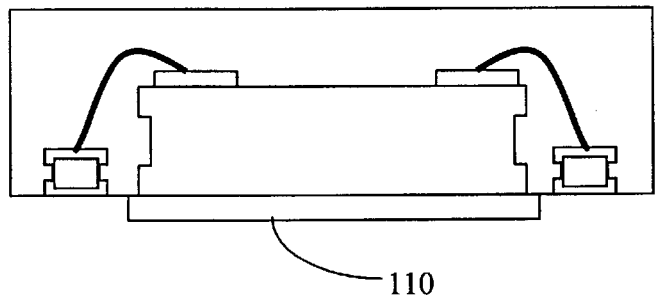
FIG. 6 shows a side sectional view of the semiconductor package in FIG. 4 with a heat sink attached.

In FIG. 6, a heatsink 110 is coupled to the mounting surface 61 of the die 62. This may be accomplished by solder, heat conductive epoxy, bonding, etc. The heatsink 110 can be made of tin-plated copper.

Hence, the present invention provides a semiconductor package which overcomes, or at least reduces the above-mentioned problems of the prior art. It will be appreciated that although only one particular embodiment of the invention has been described in detail, various modifications and improvements can be made by a person skilled in the art without departing from the scope of the present invention.

What is claimed is:

1. A semiconductor package, comprising:
    at least one semiconductor die including,
        a mounting surface,
        an interconnect surface opposite the mounting surface comprising,
            at least one die pad, and
            an intermediate die portion extending between the mounting surface and the interconnect surface;
    at least one interconnect extending out from the semiconductor die perpendicular to the interconnect surface comprising:
        an inner end coupled to the at least one die pad;
        an outer end, and
        an intermediate portion that extends between the inner end and the outer end; and
    encapsulant surrounding at least the intermediate die portion of the at least one semiconductor die, and the intermediate portion of the at least one interconnect to form the semiconductor package, whereby the mounting surface of the at least one semiconductor die and the outer end of the at least one interconnect are exposed.

2. A semiconductor package in accordance with claim 1 wherein:
    the at least one semiconductor die comprises at least one semiconductor die means for providing a device;
    the mounting surface comprises a mounting surface means for releasably mounting the at least one semiconductor die;
    the at least one die pad comprising at least on die pad means for connecting to the device and for receiving the inner end of the at least one interconnect;
    the inner end comprising an inner end means for coupling to the at least one die pad;
    the outer end comprises an outer end means for connecting to an external circuit;
    the encapsulant comprises encapsulant means for holding the at least one semiconductor die and the at least one interconnect together in the semiconductor package.

3. A semiconductor package comprising:
    at least one semiconductor die means for providing a device, the at least one semiconductor die, the at least one semiconductor die having an interconnect surface means opposite the mounting surface means and the interconnect surface means having at least one die pad means thereon, the die pad means for connecting to the device, and the at least one semiconductor die means having an intermediate die portion means extending between the mounting the at least one semiconductor die means having a mounting surface means for releasably mounting surface means and the interconnect surface means;
    at least one interconnect means for connecting the device to an external circuit, the at least one interconnect means having an inner end means for coupling to the at least one die pad, and the at least one interconnect means having an outer end means for connecting to the external circuit, and the at least one interconnect means having an intermediate portion that extends between the inner end and the outer end; and
    encapsulant means for surrounding at least the interconnect surface means and the intermediate die portion means of the at least one semiconductor die means, and the inner end means and the intermediate portion means of the at least one interconnect means, whereby the mounting surface means of the at least one semiconductor die means and the outer end means of the at least one interconnect means are exposed, the encapsulant means for holding the at least one semiconductor die means and the at least one interconnect means together in the semiconductor package.

4. A semiconductor package in accordance with claim 3 wherein the intermediate die portion means is shaped to enhance the hold of the encapsulant thereon.

5. A semiconductor package in accordance with claim 3 wherein the intermediate portion means is shaped to enhance the hold of the encapsulant thereon.

6. A semiconductor package in accordance with claim 3 further comprising a heat sink coupled to the mounting surface means for receiving heat from the at least one semiconductor die means and for dissipating heat.

7. A method for forming a semiconductor package comprising the steps of:
    providing a carrier having at least one semiconductor mounting surface; and
    providing at least one semiconductor die comprising:
        a mounting surface,
        an interconnect surface opposite the mounting surface comprising,
            at least one die pad, and
            an intermediate die portion extending between the mounting surface and the interconnect surface,
        at least one interconnect extending out from the semiconductor die perpendicular to the interconnect surface comprising:
            an inner end,
            an outer end, and
            an intermediate portion that extends between the inner end and the outer end;
    disposing the at least one semiconductor die on the carrier with its mounting surface on the at least one semiconductor mounting surface;
    coupling the inner end of the at least one interconnect to the at least one die pad;
    encapsulating at least the intermediate die portion of the at least one semiconductor die and the intermediate portion of the at least one interconnect to form the semiconductor package on the carrier, whereby at least a portion of the outer end of the at least one interconnect is exposed; and
    separating the semiconductor package and the carrier.

8. A method in accordance with claim 7 further comprising the step of disposing releasable adhesive on the at least one semiconductor mounting surface.

9. A method in accordance with claim 8, wherein separating the semiconductor package comprises the step of reducing the adhesion of the releasable adhesive.

10. A method in accordance with claim 9, wherein the at least one semiconductor mounting surface has ultra-violet reactive adhesive thereon, and wherein the step of reducing the adhesion of the releasable adhesive comprises the step of exposing the ultra-violet reactive adhesive to ultra violet radiation.

11. A method in accordance with claim 7 further comprising the step of disposing solder on the at least one die pad.

12. A method in accordance with claim 7 further comprising the step of disposing conductive epoxy on the at least one die pad.

13. A method in accordance with claim 7 wherein coupling the inner end of the at least one interconnect comprises the step of bonding the inner end of the at least one interconnect to the at least one die pad.

14. A method in accordance with claim 13, wherein the step of bonding comprises the step of eutectic bonding.

15. A method in accordance with claim 7, wherein encapsulating at least the intermediate die portion of the at least one semiconductor die and the intermediate portion of the at least one interconnect comprises the step of using first and second mould pieces to form a mould cavity.

16. A method in accordance with claim 7, wherein separating the semiconductor package and the carrier comprises the step of peeling the carrier away from the mounting surface of the semiconductor package.

* * * * *